United States Patent
Capellini et al.

(10) Patent No.: US 7,994,066 B1
(45) Date of Patent: Aug. 9, 2011

(54) SI SURFACE CLEANING FOR SEMICONDUCTOR CIRCUITS

(75) Inventors: Giovanni Capellini, Rome (IT); Gianlorenzo Masini, Carlsbad, CA (US); Lawrence C. Gunn, III, Encinitas, CA (US); Jeremy Witzens, Del Mar, CA (US); Joseph W. White, Oceanside, CA (US)

(73) Assignee: Luxtera, Inc., Carlsbad, CA (US)

( * ) Notice: Subject to any disclaimer, the term of this patent is extended or adjusted under 35 U.S.C. 154(b) by 785 days.

(21) Appl. No.: 11/871,987

(22) Filed: Oct. 13, 2007

(51) Int. Cl.
*H01L 21/302* (2006.01)

(52) U.S. Cl. ........ 438/734; 438/689; 438/706; 438/906; 257/E21.224; 257/E21.226; 257/E21.245

(58) Field of Classification Search .................. 438/496, 438/752; 257/E21.222, E21.224, E21.227
See application file for complete search history.

(56) References Cited

U.S. PATENT DOCUMENTS

| | | | | |
|---|---|---|---|---|
| 5,089,441 | A * | 2/1992 | Moslehi | 438/800 |
| 5,403,434 | A * | 4/1995 | Moslehi | 134/1.2 |
| 6,858,503 | B1 * | 2/2005 | Ngo et al. | 438/285 |
| 6,887,773 | B2 | 5/2005 | Gunn | 438/481 |
| 7,129,184 | B2 | 10/2006 | Chang | 438/750 |
| 7,235,492 | B2 | 6/2007 | Samoilov | 438/714 |
| 7,416,989 | B1 * | 8/2008 | Liu et al. | 438/706 |
| 2006/0138566 | A1 * | 6/2006 | Chakravarti et al. | 257/405 |
| 2006/0169668 | A1 * | 8/2006 | Samoilov | 216/58 |
| 2007/0012932 | A1 * | 1/2007 | Kobayakawa et al. | 257/94 |
| 2009/0075447 | A1 * | 3/2009 | Meunier-Beillard et al. | 438/378 |

OTHER PUBLICATIONS

"Effect of Si-Ge buffer layer for low-temperature Si epitaxial growth on Si substrate by RF plasma chemical vapor deposition", S. Suzuki et al., J. Appl. Phys. 54, 1466 (1983).
"Oxygen removal from Si via reaction with adsorbed Ge", J. F. Morar et al., Appl. Phys. Lett. 50, 463 (1987).
"Reduction reaction of native oxide at the initial stage of $GeH_4$ chemical vapor deposition on (100)Si", Y. Takahasi et al., Appl. Phys. Lett. 57, 599 (1990).
"Alternate surface cleaning approaches for ultra high-vacuum chemical vapor-deposition epitaxy of Si and $Ge_xSi_{1-x}$", M. Racanelli et al., J. Electrochem. Soc. 138, 3783 (1991).
"The viability of $GeH_4$-based in situ clean for low temperature silicon epitaxial growth", C. L. Wang et al., J. Electrochem. Soc. 143, 2387 (1996).
"Chemical vapour etching of Si, SiGe and Ge with HCl; applications to the formation of thin relaxed SiGe buffers and to the revelation of threading dislocations", Y. Bogumilowicz et al., Semicond. Sci. Technol. 20, 127 (2005).
"Interaction of Ge atoms with silica surfaces", S.K. Stanley et al., Appl. Surf. Sci. 252, 878 (2005).

* cited by examiner

*Primary Examiner* — Cheung Lee
(74) *Attorney, Agent, or Firm* — George Sai-Halasz

(57) ABSTRACT

A method is disclosed for the cleaning of a Si surface at low temperatures. Oxide on the Si surface is brought into contact with Ge, which then sublimates off the surface. The Ge contamination remaining after the oxide removal is cleared away by an exposure to an alkali halide. The disclosed cleaning method may by used in semiconductor circuit fabrication for preparing surfaces ahead of epitaxial growth.

21 Claims, 3 Drawing Sheets

SI SURFACE CLEANING FOR SEMICONDUCTOR CIRCUITS

FIELD OF THE INVENTION

The present invention relates to the fabrication of electronic circuits. In particular, it relates to methods of cleaning a Si surface at low temperatures.

BACKGROUND OF THE INVENTION

As function, and hence complexity, of electronic circuits increases, the art is faced with ever more challenges to stay on the path of delivering better performance. The mainstay material of microelectronics is silicon (Si), or more broadly, Si based materials. One such Si based material of importance for microelectronics is the silicon-germanium alloy: $Si_{1-x}Ge_x$, with "x" indicating the fraction of germanium. In many advanced semiconductor circuits, differing components, such as P or N type devices, three dimensional devices, possibly optical devices, may have such variations in their requirements that processing them all in a single material would compromise performance. Often there is a need to deposit high quality materials, frequently differing kind of materials, during the fabrication of the semiconductor structures.

For depositing high quality material layers one is typically in need of atomically clean surfaces onto which the deposition can take place. A problem encountered in the art is that atomically clean Si surfaces are very difficult to produce, and cleaning a Si surface usually involves high temperature. However, there is an advantage to be able to obtain a clean Si surface at lower temperatures, at which temperatures no harm occurs to those structures that are already fabricated when the need for a new material deposition arises.

SUMMARY OF THE INVENTION

In view of the discussed difficulties, embodiments of the present invention disclose a method for cleaning a Si surface. The method includes providing the Si surface in such a state that the Si surface is at least partially covered by an oxide. The method further includes supplying Ge to contact the oxide at a first temperature of between about 450° C. and about 750° C. Furthermore, the method includes exposing the Si surface to a halide at a second temperature of between about 450° C. and about 750° C., in a manner that at least a portion of the exposing is carried out without concomitantly supplying Ge.

Embodiments of the present invention also disclose a method for fabricating a semiconductor circuit. The method includes defining at least one region of the semiconductor circuit for an epitaxial deposition onto a Si surface. The method further involves ensuring that any coverage over the Si surface only contains essentially oxide. The method further includes supplying Ge to contact the oxide at a first temperature of between about 450° C. and about 750° C. Furthermore, the method includes the exposing of the Si surface to a halide at a second temperature of between about 450° C. and about 750° C., in a manner that at least a portion of the exposing is carried out without concomitantly supplying Ge. The method also contains the performing of the epitaxial deposition onto the defined region of the semiconductor circuit.

BRIEF DESCRIPTION OF THE DRAWINGS

These and other features of the present invention will become apparent from the accompanying detailed description and drawings, wherein.

DETAILED DESCRIPTION OF THE INVENTION

Figure 1:
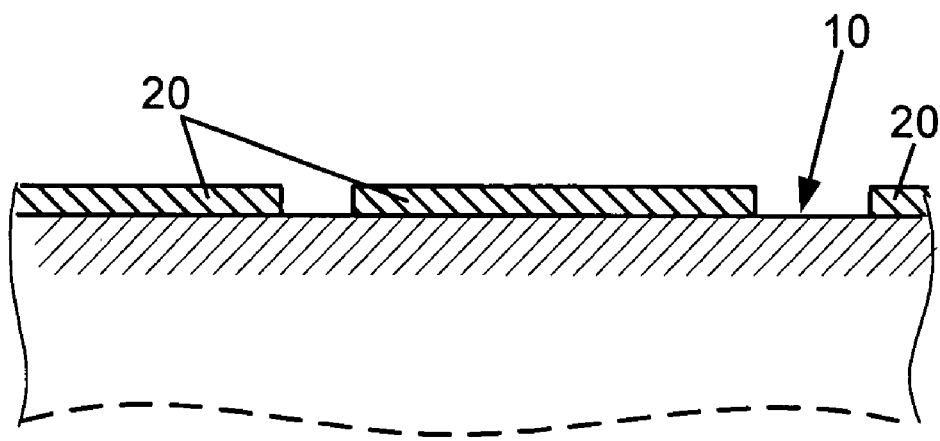
FIG. 1 shows a Si surface for a representative embodiment of the invention, in a state suitable for cleaning.

It well known in the electronics art that depositing epitaxial layers is often necessary during the fabrication of semiconductor circuits. As scaling of circuit components to ever smaller sizes continues, and inclusion of optical devices into circuit chips takes place, the desire for epitaxial deposition at relatively low temperatures increases. The lower the temperature of the epitaxial deposition may be, the more flexibility one has for integrating the fabrication process flow. The reason for this is that a lower temperature process may be less damaging to structures already in place at the time of the epitaxy, or growth. The terms "epitaxial relation", "epitaxially", "epitaxy", "epi", "epitaxial growth" etc. carry their customary usage: meaning that a layer is formed on a platform, which layer has the same symmetry and crystalline orientation as the platform itself.

Successful epitaxial deposition requires a clean surface on which the epitaxial growth can take place. It is well know in the art that in the case of Si it is very difficult to achieve a clean surface without resorting to high temperature processes. Silicon readily forms an oxide on its surface when the surface is unprotected. Upon removal, for instance by a cleaning etch, the oxide immediately re-grows even in the slightest presence of oxygen. Such a spontaneously formed oxide is usually called native oxide, and although it can be up to 3 nm thick, usually it is around 1 nm thick. Such very thin, possibly inadvertently formed, oxides might not always cover fully the surface. Such a surface with possibly holes in the oxide, would be called a partially oxide covered surface.

The term "oxide" by itself in this disclosure means the oxide of silicon. The stoichiometric chemical composition of oxide is $SiO_2$. However, in advanced technologies one is often dealing with layers as thin as 1 nm, or even less. In thin layers, due to interfacial effects and possible intermixing between various layers, the average composition of any given layer may not match exactly its supposed bulk composition. Therefore, in case of oxide it is understood that one might think of a composition of $SiO_x$, with "x" being a number in the almost 0 to 2 range.

Removing oxide from a Si surface to a degree necessary for epitaxial deposition requires usually a high temperature procedure, typically around 800° C. Thus, in the epitaxial deposition, for instance of $Si_{1-x}Ge_x$, one may encounter the highest temperature during the surface cleaning, rather than the epi growth itself. The latter may require no higher temperature than 350° C. Since the standard Si surface cleaning, which includes removal of oxide, requires such high temperatures, it means that one may have to do epitaxial deposition in the very early stages of fabricating a semiconductor circuit. Namely, at a point when most of the device processing has not as yet been completed. Devices in later stages of their fabrication, for instance FET devices when the sources and drains have already been formed, may be detrimentally impacted by temperatures even around 700° C.

Embodiments of the present invention offer methods to clean a Si surface to a degree which is suitable for epitaxial deposition at temperatures significantly lower than conventional Si surface cleaning. By offering such low temperatures, representative embodiments of the invention also point to new methods of semiconductor circuit fabrication. In such a fabrication epitaxial growth is possible at later stages of the processing, when practically completed devices might already be present on the surface.

FIG. 1 shows a Si surface for a representative embodiment of the invention, in a state suitable for commencing cleaning steps. A Si surface 10 is provided, which surface may pertain to any number of structures know in the art. Without limiting other possibilities, the Si surface 10 may be the exterior of a substrate, such as bulk, or semiconductor on insulator (SOI), or exterior of a thin membrane. The Si surface 10, may be the exterior of single crystalline Si, or possibly of polycrystalline Si. The Si surface 10 may be part of a larger area on which various features may already have been processed.

The Si surface 10 is at least partially covered by an oxide 20, the composition of which, as discussed earlier, may be described as $SiO_x$. Usually an oxide 20 would fully cover the Si surface 10, but one may allow for the possibility that this oxide 20 may have some holes in it. However, even in its partial coverage state this oxide 20 would be an obstacle to such processing of the Si surface 10 which would require a cleanness on an atomic level, for instance an epitaxial deposition.

If a significant amount of contaminants, or various layers used in microelectronics processing, such as for instance, a nitride layer, were present on the Si surface 10, these would have been removed before the Si surface 10 reached the state shown in FIG. 1, where it is covered essentially with an oxide layer, and possibly with very small amounts of impurities. There are a variety of known methods in the art for the removal of contaminants and/or of differing layers. Such removals often take the form of a wet etch, which solutions frequently contain hydrogen fluoride (HF). In some embodiments of the invention, a very thin oxide layer may have been purposefully disposed over the Si surface 10. Such thin oxides may be grown, for instance, thermally, or chemically. It is also possible that the Si surface 10 may require no pre-cleaning treatment at all, as it might have a so called native oxide covering it, the kind which readily forms on an exposed Si surface.

Figure 2:
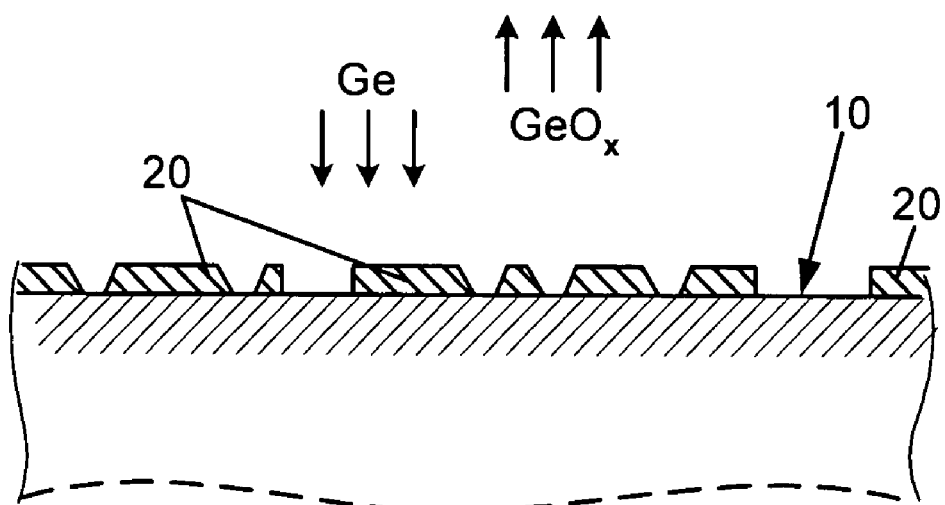
FIG. 2 shows the Si surface in contact with Ge, with Ge removing the oxide coverage.

FIG. 2 shows the Si surface in contact with Ge, with the Ge removing the oxide coverage. It is known in the art that germanium oxide $GeO_x$, with "x" in average being between almost 0 and 2, becomes volatile at relatively low temperatures, already around 400° C. If one brings Ge into contact with the silicon oxide 20, Ge may reduce the silicon oxide, namely, germanium taking on oxygen, and then sublimate. In this manner the Ge gradually cleans the Si surface 10, removing the originally present oxide 20. FIG. 2 shows schematically a stage in this process with Ge arriving, and $GeO_x$ leaving, and the oxide 20 being diminished. Some forms of the reduction of silicon oxide by germanium, and removal of oxide from silicon, has already been studied, and responsible chemical mechanisms published. Such studies may be found, for instance, in: "Reduction reaction of native oxide at the initial stage of $GeH_4$ chemical vapor deposition on (100) Si", Y. Takahasi et al., Appl. Phys. Lett. 57, 599 (1990), and "Oxygen removal from Si via reaction with adsorbed Ge", J. F. Morar et al., Appl. Phys. Lett. 50, 463 (1987), and "Interaction of Ge atoms with silica surfaces", S. K. Stanley et al., Appl. Surf. Sci. 252, 878 (2005), all three of these publications are incorporated herein by reference.

In representative embodiments of the invention the Ge may be brought into contact with the oxide 20 in the form of a germane $GeH_4$ gas. Typically one would insert the oxide 20 on the Si surface 10 into a Chemical Vapor Deposition (CVD) reactor, and let $GeH_4$ flow into the reaction chamber. In exemplary embodiments a hydrogen ($H_2$) carrier gas may be used together with the $GeH_4$ gas. Typically one may use a $GeH_4$:$H_2$ flow ratio of between about $10^{-3}$ and about $10^{-4}$, at a first temperature of between about 450° C. and about 750° C. The speed of the reactions, and consequently the rate of the oxide 20 removal, depends on the temperature and also on the partial pressure, P, of $GeH_4$ in the gas mixture. For instance, the oxide reduction time may scale as $P^{-0.5}$. Such parameters, and the oxide thickness to be removed all contribute for determining the time for the oxide removal, which may be in the about 5 seconds to about 60 seconds range.

In alternate embodiments of the invention one may be using other than $H_2$ as a carrier gas in the CVD reactor. Such alternate carrier gases may be $N_2$, or an alkali halide, as well.

Alternate ways to introduce Ge can bring further variations to embodiments of the invention. The reactive species of $GeH_4$ may be replaced with species of similar character, such as $Ge_2H_6$, or $(GeH_3)CH_3$. In further embodiments one may use elemental Ge as the reactive species. Gas phase reactants such as $GeH_4$, $Ge_2H_6$, or $(GeH_3)CH_3$ may be used in systems such as CVD-s with various pressures: atmospheric (AP), reduced (RP), low (LP), ultra high vacuum (UHV), or in plasma enhanced PE-CVD, as well as in Atomic Layer Epitaxy (ALE), or Molecular Beam Epitaxy (MBE) systems. Elemental Ge may be introduced for contact with the oxide in Molecular Beam Epitaxy (MBE), or Physical Vapor Deposition (PVD) systems. All of the mentioned systems are known in the art, and they serve as examples without any intent of limiting the possibility of any other system that may be used for hosting the reactions of Ge removing silicon-oxide. It follows, however, that the temperature and reaction time for oxide reduction can vary depending on the reactive species used, and on the nature of the reaction's hosting systems.

The reaction of Ge with the $SiO_x$ 20 on the Si surface 10, may on occasion be interrupted for thermal annealing, by introducing a so called process interruption (PI). During such a PI no Ge is supplied, and the temperature, a third temperature, may be selected independently, but typically it would stay in the about 450° C. and about 750° C. range. The lower bound of the temperature range, 450° C., arises because it is the minimum temperature needed for significant $GeO_x$ sublimation. A PI may be advantageous in increasing Ge diffusion to the oxide 20. Before a given oxide is fully reduced by the Ge contact, one may use several cycles of PI followed by a reintroduction of Ge.

Figure 3:
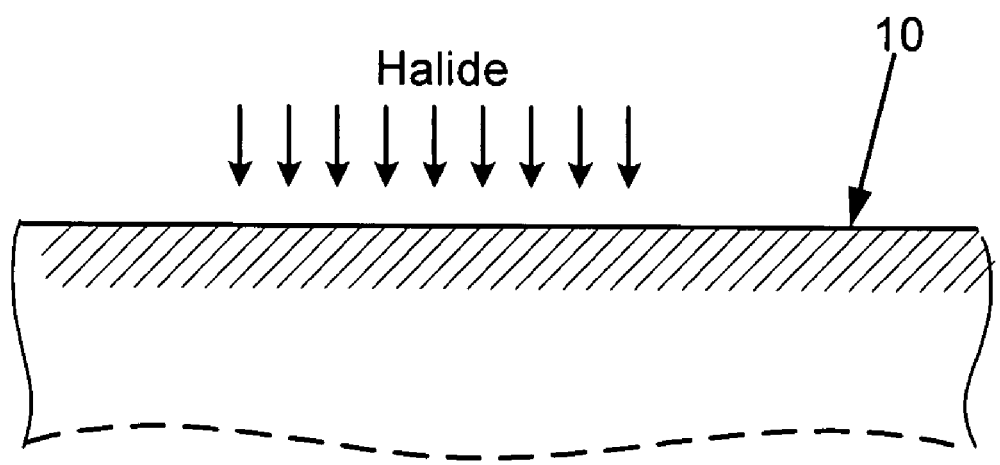
FIG. 3 shows the Si surface as it is exposed to a halide, with Ge being cleared off the surface.

FIG. 3 shows the Si surface as is exposed to a halide, with Ge being cleared off the surface. Although the step of contacting the oxide 20 with Ge may have resulted in sublimating essentially all of the oxide, the Si surface 10 may still not be atomically clean because there may remain a Ge build-up on the Si-surface 10. Part of the Ge remaining on the surface may be due to a so called Epitaxial Lateral Overgrowth (ELO) effect. As the Ge-oxide is sublimating there are more holes, or pits, in the oxide, and Ge may start epitaxial growth over the exposed Si surfaces. The Ge growth may continue out of the pits laterally and overgrowing the oxide 20. For obtaining a good quality clean Si surface suitable for high quality epitaxy, it is desirable to fully remove the Ge build-up. This aim may be accomplished with the exposure of the Si surface 20 to a halide at a second temperature, which again has a range of between about 450° C. and about 750° C.

While the ranges of the first, second, and third temperatures are the same, during the individual steps to which these temperatures pertain, the temperatures can be independently selected, serving the purposes of each particular step. The choice of the various temperatures may be dictated by specific limits on temperatures, the various chemical components involved at each step, and other known conditions, such as process time, process pressure, and number of PI cycles.

In representative embodiments of the invention the halide exposure is performed in the same system as the Ge contact occurred. Usually the Si surface is not removed, only the reacting chemistry is changed. However, if necessary, the Si surface 10 may be moved to a different reactor, or system, for the halide exposure, but in a manner that the Si silicon surface does not become exposed to oxygen, or other contamination in such a transfer. This would mean that the Si surface would remain in some containment environment if a transfer would be carried out. However, typically systems suitable for bringing Ge in contact with the oxide, would be also suitable for the halide exposure.

In typical embodiments, hydrogen chloride (HCl) is introduced in the CVD reactor with $H_2$ carrier gas. The $HCl:H_2$ flow ratio may be chosen to be between about $10^{-2}$ and about 1. The reaction time, again, depends on the partial pressure of the alkali halide, which typically would be HCl. For fully cleaning the surface a 5 second to 60 second exposure to HCl would be typical.

In the alkali halide exposure step, just as in the Ge contacting step, there are several possible different embodiments that can be carried out. One may choose a different alkali halide, or select another carrier gas, for instance $N_2$, or possibly not using a carrier gas at all for the alkali halide.

During at least a portion of the alkali halide exposure no Ge is supplied concomitantly to the Si surface. In some embodiments, the supplying of the Ge may overlap initially with the alkali halide, usually HCl, exposure, but in the latter portion of the alkali halide exposure no Ge is supplied in either gas, or elemental form.

The alkali halide, such as HCl, cleans the Si-surface once the Ge supply is cut off. In the art it is known that alkali halides can remove Ge, but such removal was typically practiced together with supplying Ge at the same time. It was thought that a clean Si surface may only be achieved with constant supply and removal of Ge, such that the removal is slightly faster than the re-supply of Ge. Such balancing has not been successful. This negative result has been accepted in the art, as for instance, published in: "The viability of $GeH_4$-based in situ clean for low temperature silicon epitaxial growth", C. L.: Wang et al., J. Electrochem. Soc. 143, 2387 (1996). The accepted art teaches that $GeH_4$ is not suitable for removing oxide from a Si surface in a fully satisfactory manner because of an inevitable Ge build up on the surface.

In embodiments of the present invention the Ge contact step is followed up with an exposure to an alkali halide while there is a full cut off of all Ge supply. This two step approach has not been explored previously, and in the embodiments of the present invention, in contrast with expectations of the art, it yields Si surfaces free of oxide, and free of any other impurity.

The removal of Ge from the Si surface by halide exposure also has the advantage of being a well controllable, repeatable process. Above about 475° C., this process is characterized a being mass controlled. This means that the reaction rate depends on the arrival of the halide to the surface, since essentially all halide atoms reaching the surface will be involved in reactions. The robustness of the process arises because the flow rate reaching the Si surface is a well controllable parameter, and because the process itself is less sensitive to local and global temperature fluctuations.

In a further embodiment of the invention the step of supplying Ge and the step of exposing the Si surface to a halide may be repeated one or more times. Typically, with each repetition the Si surface would become cleaner, until it reaches a predetermined state of cleanness. The are known method in the art to determine the amount of contamination on a surface, and hence it state of cleanness. In a representative embodiment, the steps of supplying Ge and of exposing the Si surface to a halide would be repeated less than 10 times, typically 1 to 3 times. The cleaning process involves sublimation, consequently it is self limiting.

When the Si surface is sufficiently clean, either with or without repetition of steps, it is ready for further processing. If the Si surface pertains to a single crystal material, and epitaxial deposition is desired, that can be carried out at this point. If the Si surface is polycrystalline in nature, its cleanliness allows other processes of interest to take their place.

Figure 4:
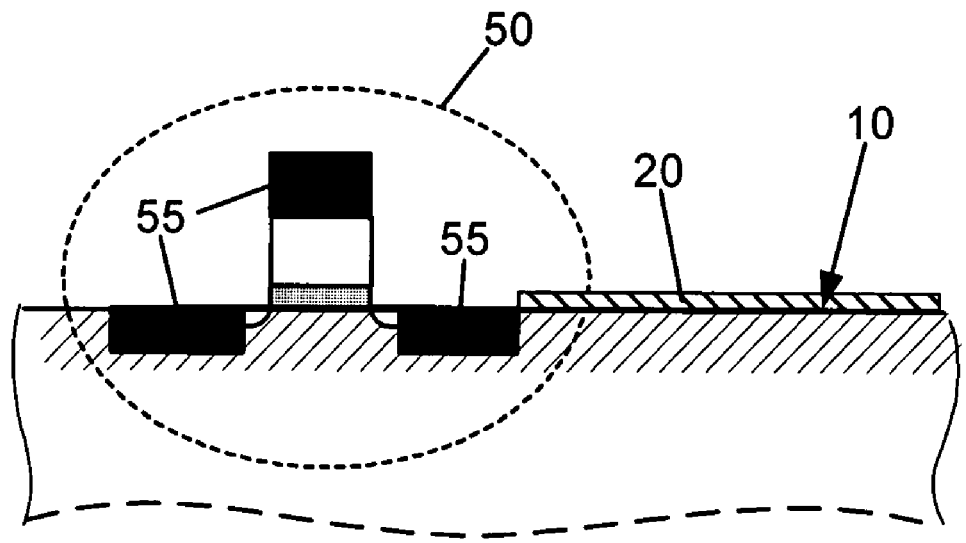
FIG. 4 schematically shows a semiconductor circuit in an exemplary embodiment of the invention, as the circuit is in need of an epitaxial deposition.

FIG. 4 schematically shows a semiconductor circuit in an exemplary embodiment of the invention, as the circuit is in need of an epitaxial deposition, and hence of Si surface cleaning. As an example, and without intent of limitation, FIG. 4 shows schematically a circuit having FET transistors, one of which is indicated inside the dotted ellipse 50. The circuit may be a CMOS circuit, which as it is well known, contains FET devices in particular configurations. It is understood that Field Effect Transistor-s (FET) are well known in the electronic arts. Standard component of a FET are the source, the drain, the body in-between the source and the drain, and the gate. The gate is overlaying the body and is capable to induce a conducting channel in the body between the source and the drain. The gate is typically separated from the body by the gate insulator. In state of the art FET devices the source, the drain, and often the gate, as well, have a silicide layer formed over them, typically in order to improve conductivity, and to reduce contact resistance.

Semiconductor circuits are often in need of epitaxial deposition of various layers. As usual, the problem is that epitaxial deposition necessitates atomically clean surfaces, achieving of which with methods known in the art typically require high temperatures. If one could carry out cleaning without damaging the device structures already fabricated, such as an FET 50, it may significantly simplify the whole semiconductor circuit fabrication. The FET 50 may be in an advanced state of fabrication, such as having been through a silicidation step. Without intent of limitation, FIG. 4 shows a case where the FET has silicided 55 source/drain and gate, as it is often practiced in the art. Once the silicide is in place the temperature should not again exceed the silicide formation temperature because of the damage which consequently would be caused to the FET 50.

The semiconductor circuit has a region defined for an epitaxial deposition onto the Si surface 10. One would have to ensure that the coverage over the Si surface is essentially of only an oxide layer, without significant presence of other possible contaminants. This ensuring means that if there were other contaminants, such as for instance other dielectrics, or metal layers from earlier processing, these would be removed using known methods in the art. However, the oxide layer 20, either a re-formed native oxide, or a purposefully disposed one, is the one which can resist standard removal methods. FIG. 4 shows a continuous oxide, but again the figure is only for illustration, and it is not meant to limit any possibility, or variation. The oxide 20 may be so thin that it is porous, nevertheless posing an obstacle for epitaxial deposition over the Si surface 10.

One may employ one of the embodiments of the invention as presented in relation to FIGS. 1-3, and clean the defined Si surface 10 of the semiconductor circuit. The lower limits on the temperature for carrying out the cleaning, about 450° C., is safely below the temperature which would damage the devices. In particular, it is below the temperature of silicide sensitivity, even for NISI, which has a very low temperature for the ohmic/insulating phase transition. NiSi is expected to be the most common silicide in advanced high performance CMOS circuits, such as processors, or optical communication circuits.

Figure 5:
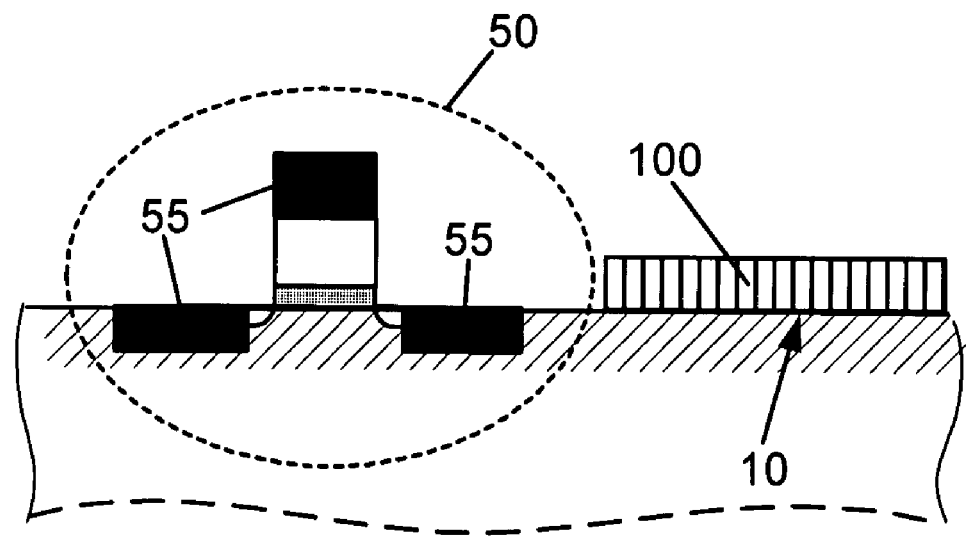
FIG. 5 schematically shows the semiconductor circuit after surface cleaning and epitaxial growth, while preexisting structures remain unaffected.

Having finished with the cleaning one can proceed with epitaxial deposition, the result of which is schematically shown in FIG. 5, as the state of the semiconductor circuit after surface cleaning and epitaxial growth, with the preexisting structures remaining unharmed. The epitaxially deposited layer 100 may be any kind of the large number of known epitaxial layers, such as insulating layers, semiconducting layers, or metallic layers. In some embodiments, for instance, for high performance, or for optical applications, one may desire to deposit silicon-germanium, with "x" indicating the fraction of germanium. On the well cleaned Si-surface 10, one may deposit the whole range of possible $Si_{1-x}Ge_x$ compositions, form pure Si to pure Ge, namely "x" may have a range of $0 \leq x \leq 1$.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

We claim:

1. A method for cleaning a Si surface, the method comprising:
   providing the Si surface, wherein the Si surface is at least partially covered by an oxide;
   supplying Ge to contact the oxide at a first temperature of between about 450° C. and about 750° C. in such manner that Ge build-up takes place on the Si surface; and
   exposing the Si surface to a halide together with a carrier gas at a second temperature of between about 450° C. and 650° C., wherein at least a portion of the exposing is carried out without concomitantly supplying Ge.

2. The method of claim 1, wherein the supplying of Ge is followed by a thermal annealing at a third temperature of between about 450° C. and about 750° C.

3. The method of claim 1, wherein the exposing to the halide is carried out by supplying hydrogen chloride (HCl) gas together with hydrogen ($H_2$) for the carrier gas, and selecting a HCl to $H_2$ flow ratio of between about $10^{-2}$ and about 1.

4. The method of claim 3, wherein the exposing to the HCl has a duration of between about 5 seconds and about 60 seconds.

5. The method of claim 1, wherein the method further comprises repeating the supplying of Ge and the exposing to the halide steps until the Si surface reaches a predetermined state of cleanness.

6. The method of claim 1, wherein the providing the Si surface comprises wet etching the Si surface with a solution comprising hydrogen fluoride (HF).

7. The method of claim 1, wherein the providing the Si surface comprises growing an oxide on the Si surface, and selecting the oxide thickness to be less than about 1 nm.

8. The method of claim 1, wherein the supplying of Ge is carried out by supplying germane ($GeH_4$) gas together with hydrogen $(H_2)_4$ and selecting a $GeH_4$ to $H_2$ flow ratio of between about $10^{-3}$ and about $10^{-4}$.

9. The method of claim 1, wherein supplying of Ge is carried out by supplying germane ($GeH_4$) gas together with nitrogen ($N_2$).

10. The method of claim 1, wherein the supplying of Ge is carried out by supplying $Ge_2H_6$ gas.

11. The method of claim 1, wherein the supplying of Ge is carried out by supplying $(GeH_3)CH_3$ gas.

12. The method of claim 1, wherein the supplying of Ge is carried out by supplying elemental Ge.

13. A method for fabricating a semiconductor circuit, the method comprising:
   defining at least one region of the semiconductor circuit for an epitaxial deposition onto a Si surface;
   ensuring that coverage over the Si surface consists essentially of an oxide;
   supplying Ge to contact the oxide at a first temperature of between about 450° C. and about 750° C. in such manner that Ge build-up takes place on the Si surface;
   exposing the Si surface to a halide together with a carrier gas at a second temperature of between about 450° C. and 650° C., wherein at least a portion of the exposing is carried out without concomitantly supplying Ge; and
   performing the epitaxial deposition onto the least one region.

14. The method of claim 13, wherein the semiconductor circuit is characterized as being a CMOS circuit comprising FET devices, and the method further comprises processing the FET devices up to a predetermined state of completion before carrying out the step of defining the at least one region of the semiconductor circuit for the epitaxial deposition onto the Si surface.

15. The method of claim 14, wherein the predetermined state of completion includes silicide formation for the FET devices.

16. The method of claim 13, wherein the exposing to the halide is carried out by supplying hydrogen chloride (HCl) gas together with hydrogen ($H_2$) for the carrier gas, and selecting a HCl to $H_2$ flow ratio of between about $10^{-2}$ and about 1.

17. The method of claim 13, wherein the method further comprises repeating the supplying of Ge and the exposing to the halide steps until the Si surface is sufficiently clean to receive the epitaxial deposition.

18. The method of claim 13, wherein in performing the epitaxial deposition $Si_{1-x}Ge_x$ is selected for deposition, with "x" having a range of $0 \leq x \leq 1$.

19. The method of claim 13, wherein performing the ensuring step comprises wet etching the Si surface with a solution comprising hydrogen fluoride (HF).

20. The method of claim 13, wherein performing the ensuring step comprises growing an oxide on the Si surface, and selecting the oxide thickness to be less than about 1 nm.

21. The method of claim 13, wherein the supplying of Ge is carried out by supplying germane ($GeH_4$) gas together with hydrogen ($H_2$), and selecting a $GeH_4$ to $H_2$ flow ratio of between about $10^{-3}$ and about $10^{-1}$.

* * * * *